(12) United States Patent
Jenkins et al.

(10) Patent No.: US 9,276,524 B2
(45) Date of Patent: *Mar. 1, 2016

(54) HIGH FREQUENCY OSCILLATOR CIRCUIT

(75) Inventors: Keith A. Jenkins, Sleepy Hollow, NY (US); Yu-ming Lin, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 859 days.

This patent is subject to a terminal disclaimer.

(21) Appl. No.: 13/569,815

(22) Filed: Aug. 8, 2012

(65) Prior Publication Data

US 2015/0303871 A1 Oct. 22, 2015

Related U.S. Application Data

(63) Continuation of application No. 13/551,708, filed on Jul. 18, 2012, now Pat. No. 8,816,787.

(51) Int. Cl.
*H03B 7/06* (2006.01)
*H03B 5/12* (2006.01)
*H01L 29/16* (2006.01)
*H01L 29/786* (2006.01)

(52) U.S. Cl.
CPC .......... *H03B 5/1228* (2013.01); *H01L 29/1606* (2013.01); *H01L 29/78684* (2013.01); *H03B 5/1203* (2013.01); *H03B 7/06* (2013.01); *H03B 2200/0084* (2013.01)

(58) Field of Classification Search
CPC .............. H03B 7/06; H03B 7/02; H03B 7/00; H03B 5/12; H03B 5/1203; H03B 5/12; H03B 2200/0028; H03B 2200/084
USPC .......................... 331/115, 132, 117 R, 117 FE
See application file for complete search history.

(56) References Cited

U.S. PATENT DOCUMENTS

| | | | |
|---|---|---|---|
| 3,691,481 A * | 9/1972 | Kataoka et al. | 331/107 G |
| 4,547,750 A | 10/1985 | Torizuka et al. | |
| 6,927,640 B2 * | 8/2005 | Gomez | 331/116 FE |
| 7,652,310 B2 | 1/2010 | Sugaya et al. | |
| 7,839,226 B2 * | 11/2010 | Frazier | 331/107 T |
| 2010/0127243 A1 | 5/2010 | Banerjee et al. | |

(Continued)

FOREIGN PATENT DOCUMENTS

WO WO2011046655 4/2011

OTHER PUBLICATIONS

Wu et al., "Three-Terminal Graphene Negative Differential Resistance Devices", ACS nano 6.3 (Feb. 10, 2012): 2610-2616.*

(Continued)

*Primary Examiner* — Ryan Johnson
(74) *Attorney, Agent, or Firm* — Harrington & Smith

(57) ABSTRACT

An oscillator circuit includes a field effect transistor and a resonant circuit having a first terminal connected to the field effect transistor. The resonant circuit includes an inductance and a capacitance and has a second terminal for connecting to a radiator. The field effect transistor includes a gate electrode coupled to a source of gate voltage, a source electrode, a drain electrode and a graphene channel disposed between the source electrode and the drain electrode and electrically connected thereto. The graphene channel is disposed relative to the gate electrode for being biased by the gate electrode into a negative differential resistance region of operation. The oscillator circuit is capable of generating a continuous wave THz frequency signal, and is further capable of being enabled and disabled by the bias applied to the gate electrode.

12 Claims, 3 Drawing Sheets

(56) References Cited

U.S. PATENT DOCUMENTS

| | | | |
|---|---|---|---|
| 2010/0284156 A1 | 11/2010 | Tour et al. | |
| 2011/0163289 A1 | 7/2011 | Zhu | |
| 2011/0284818 A1 | 11/2011 | Avouris et al. | |
| 2012/0001698 A1 | 1/2012 | Koyama et al. | |
| 2012/0038429 A1* | 2/2012 | Haensch et al. | 331/117 FE |
| 2012/0119838 A1 | 5/2012 | Koyama et al. | |

OTHER PUBLICATIONS

Nguyen et al., "Large Peak-To-Valley Ratio of Negative-Differential-Conductance in Graphene P-N Junctions", Journal of Applied Physics, 109, 093706 (2011) American Institute of Physics.

Lin et al., "100-GHz Transistors From Wafer-Scale Epitaxialgraphene", Feb. 5, 2010, vol. 327 Science, www.sciencemag.org.

Wang et al., "Emerging Nanodevice Paradigm: Graphene-Based Electronics for Nanoscale Computing", ACM Journal on Emerging Technologies in Computing Systems, vol. 5, No. 1, Article 3, Pub. Date Jan. 2009.

Yang et al., "Triple-Mode Single-Transistor Graphene Amplifier and Its Applications", vol. 4, No. 10 ACS Nano, published online Oct. 2010, www.acsnano.org.

Lin et al., "Wafer-Scale Graphene Integrated Circuit", Jun. 10, 2011, vol. 332, Science, www.sciencemag.org.

* cited by examiner

HIGH FREQUENCY OSCILLATOR CIRCUIT

CROSS-REFERENCE TO A RELATED U.S. PATENT APPLICATION

This patent application is a continuation application of U.S. patent application Ser. No. 13/551,708. filed Jul. 18, 2012 now U.S. Pat. No. 8,816,787, the disclosure of which is incorporated by reference herein in its entirety.

STATEMENT OF GOVERNMENT RIGHTS

This invention was made with Government support under Contract No.: FA8650-08-C-7838 awarded by the Defense Advanced Research Projects Agency (DARPA). The Government has certain rights in this invention.

TECHNICAL FIELD

The exemplary embodiments of this invention relate generally to electronic devices, transistors, field effect devices, field effect transistors (FETS) and to circuits capable of generating microwave and terahertz (THz, $10^{12}$ Hz) frequency signals and waveforms, as well as to electrical circuits that include such FETS.

BACKGROUND

Terahertz radiation represents electromagnetic waves with frequencies in the range of 0.3 to 3 THz (100 μm to 1 mm). This frequency spectrum lies between the microwave and the optical (far Infrared) spectral bands. THz radiation is important and promising for applications such as, but not limited to, high-bandwidth communications, medical, biological and industrial imaging, the non-invasive imaging of concealed items, radar, and space science.

SUMMARY

In a first aspect thereof the exemplary embodiments of this invention provide a device for generating high frequency signals. The device is comprised of a gate electrode; a source electrode; a drain electrode; and a graphene channel disposed between the source electrode and the drain electrode and electrically connected thereto. The graphene channel is disposed relative to the gate electrode for being biased by the gate electrode into a negative differential resistance region of operation.

In another aspect thereof the exemplary embodiments of this invention provide a circuit that comprises a field effect transistor and a resonant circuit having a first terminal connected to the field effect transistor. The resonant circuit is comprised of an inductance and a capacitance and has a second terminal for connecting to a radiator. The field effect transistor is comprised of a gate electrode coupled to a source of gate voltage, a source electrode, a drain electrode and a graphene channel disposed between the source electrode and the drain electrode and electrically connected thereto. The graphene channel is disposed relative to the gate electrode for being biased by the gate electrode into a negative differential resistance region of operation.

BRIEF DESCRIPTION OF THE SEVERAL VIEWS OF THE DRAWINGS

FIG. 1B presents an elevational view of the FET of FIG. 1A (various layer thicknesses are not drawn to scale).

DETAILED DESCRIPTION

Figure 1A:
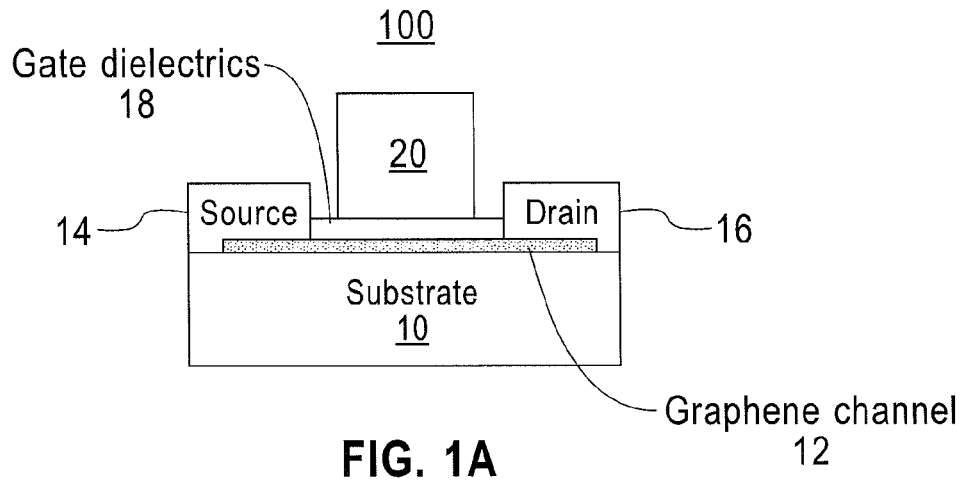
FIGS. 1A and 1B, collectively referred to as FIG. 1, show enlarged cross-section views of an exemplary graphene field-effect transistor (FET) with a top-gate configuration, where

The efficient generation and detection of THz radiation remains challenging, resulting in what has been referred to as a "terahertz gap". This is due at least in part to the fact that a continuous wave (CW), compact, efficient, high-power, and inexpensive terahertz source that operates at room temperature has not existed. Realization of such a THz source enables numerous opportunities in, for example, communication, imaging and medical applications.

In principle, the generation of THz radiation can be approached by the use of at least two different technologies. For example, from the higher side of the THz frequency band an extension of optical techniques to generate and detect THz waves could be applied. However, this technique is usually limited by the fact that terahertz energies (~1 meV) are much smaller than the energy gaps in typical semiconductors as well as the thermal energy at room temperature (~25 meV). In addition, the use of photonic devices to generate THz radiation typically requires costly, complicated and bulky components. From the lower side of THz frequency band various two terminal electronic-based devices such as the Gunn diode, resonant tunneling diodes (RTD) and impact avalanche transit time (IMPATT) diodes have been widely investigated. One common and limiting feature of these types of two terminal electronic devices is the negative differential resistance behavior in their respective current-voltage (I-V) characteristics. The adoption of RF (radio frequency) electronics technology into the terahertz regime has been limited as the cutoff frequency for transistors lies in the hundreds of gigahertz range, substantially below the THz range.

The various non-limiting examples of the embodiments of this invention provide at least a device and method to generate microwave and THz radiation based on three terminal graphene field-effect devices. The non-limiting examples of embodiments provide a device and circuit design that can be readily integrated with existing electronic technology to yield a THz signal source that is compact, low-power and portable.

Graphene is an allotrope of carbon characterized by having a structure of one-atom-thick planar sheets of sp2-bonded carbon atoms that are packed in a honeycomb (hexagonal) crystal lattice network. Graphene possesses an inherently high carrier mobility. In addition graphene provides a possibility to form a graphene layer to enable a very thin body thickness, such as one having as little as one carbon atom in thickness. The high-frequency operation of graphene-based field-effect transistors, for example beyond 300 GHz, has been demonstrated.

The operational principle of THz frequency generation in the embodiments of this invention is based at least in part on a negative differential resistance (NDR) behavior in graphene field-effect devices under certain conditions. In view of the excellent electrical properties of graphene and minimal parasitics associated with a relatively simple design, the exemplary embodiments of graphene circuits provide an alternative and improved method for generating electromagnetic waves in the microwave and THz spectra.

In accordance with non-limiting examples of the embodiments this invention there is provided a technique to generate microwave and/or THz radiation based on graphene field-effect devices (FETs). This is achieved at least in part by operating the graphene FETs in a regime that exhibits negative differential resistance (NDR) behavior.

Exemplary embodiments of the graphene FETS have three terminals: a source, a drain and a gate. The source and drain electrodes are contacted directly with the graphene while the gate is separated from a graphene channel by a thin layer of insulating dielectric. The channel of such a graphene FET is embodied with a little as a single atomic layer of graphene, where the channel conduction is modulated by an electrical potential applied to the gate. The negative differential resistance that can be made to exist in the graphene channel can be achieved for a range of source-drain biases. When properly coupled to a resonant circuit that includes, for example, at least one inductor and one or more capacitors, the NDR effect in the graphene FET can be exploited to generate continuous and stable oscillations at a designated frequency in the microwave and/or THz frequency band(s).

By the use of the exemplary embodiments of this invention the high carrier mobility and saturation velocity of graphene makes it possible to achieve a very high oscillation frequency as compared to other types of NDR devices. In addition, the planar structure of graphene makes it compatible with wafer-scale processes and facilitate for integration with silicon-based microelectronics. Furthermore, the characteristics and the operation of the THz generation circuit in accordance with certain embodiments of this invention can be tuned by using the gate electrode. For example, fast switching can be realized by controlling the gate voltage to turn "on" and "off" microwave/THz radiation generation. Still further, high-power emitted radiation can be achieved by placing more than one radiation source (more than one microwave/THz FET) in a single cavity.

Figure 1B:
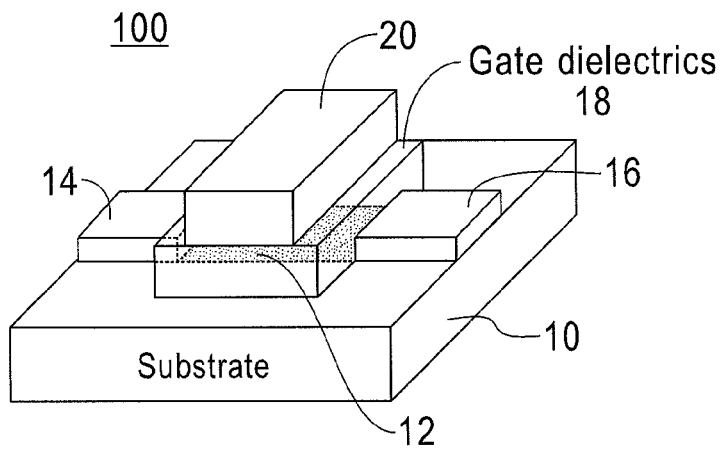

FIGS. 1A and 1B, collectively referred to as FIG. 1, show an exemplary graphene field-effect device 100 with a top-gate configuration. FIG. 1 illustrates the top-gated configuration having a dielectric substrate 10 that has a graphene layer forming a graphene channel 12 formed over a surface of the substrate 10. The graphene channel 12 is disposed so as to at least partially underlie and to electrically contact a source region 14 and a drain region 16. Disposed above the graphene channel 12 is a gate dielectric layer 18 that underlies a gate region 20. Connected with the source region 14 is a source electrode, connected with the drain region 16 is a drain electrode and connected with the gate region 20 is a gate electrode so that electrical contact can be made to the three terminal graphene FET 100.

Figure 2:
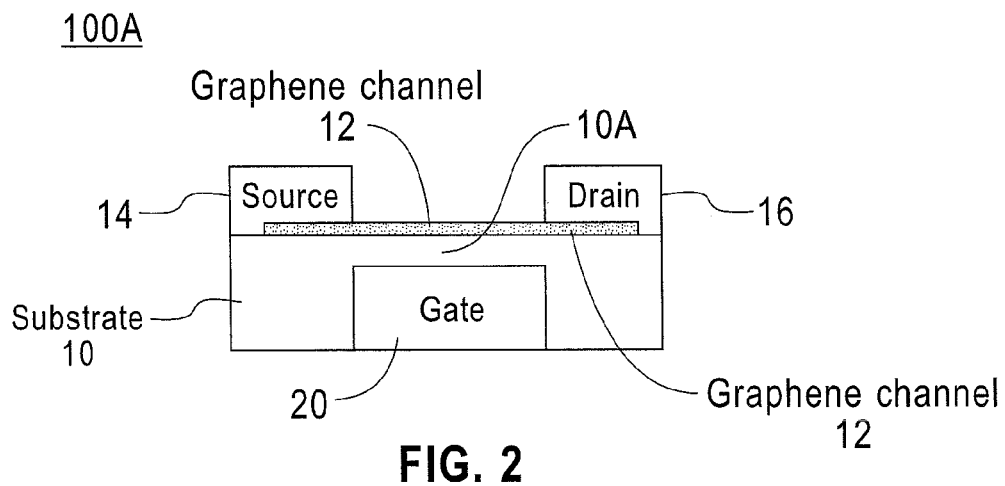
FIG. 2 shows an enlarged cross-sectional view of a bottom-gated graphene FET.

FIG. 2 shows a cross-sectional view of a bottom-gated graphene FET 100A. In this embodiment an intervening portion 10A of the substrate 10 can function as the gate dielectric 12. Alternatively a separate date dielectric layer 18, as in FIG. 1, can be provided.

In either the embodiment of FIG. 1 or FIG. 2 the graphene layer/channel 12 can be epitaxially grown on, for example, a SiC substrate 10, or grown by chemical vapor deposition (CVD) on another substrate and transferred to the desired substrate. Other suitable substrate materials include, as a non-limiting example, a diamond-like carbon, oxidized silicon, quartz, and sapphire.

In the two examples shown in FIGS. 1 and 2 the source/drain regions 12, 14 can be formed by a metal or a metal-containing system. Non-limiting examples of metals (and metal-containing alloys and layered systems) can include Au, Pd, Al, W, Ni, Cr, Cu, Ti, etc., and can be deposited using, for example, lithography and lift-off techniques. The channel of the graphene FET structure can be defined by lithography, where any excess graphene can be removed by, for example, the use of an oxygen plasma etch process.

In the top-gate configuration shown in FIG. 1 the dielectric layer 18 can be formed as a layer of electrical insulator (e.g., about 1 nm to about 100 nm in thickness) followed by the formation of the gate electrode 20 by a lithography and lift-off process. Non-limiting examples of gate dielectrics 18 can include, but are not limited to, aluminum oxide, hafnium oxide, silicon oxide, yttrium oxide and zirconium oxide. Some of these are recognized in the art as being so-called high dielectric constant (high-k) dielectric materials, as compared to $SiO_2$. For example, the gate dielectric 18 can be formed as a layer of high dielectric constant (high-k) material comprising a dielectric metal oxide and having a dielectric constant that is greater than the dielectric constant of silicon nitride of 7.5. The high-k dielectric layer 18 may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x can be independently from 0.5 to 3 and each value of y can be independently from 0 to 2. The thickness of the high-k dielectric layer 18 may be from about 1 nm to about 10 nm (or greater). The high-k dielectric layer 18 can have an effective oxide thickness (EOT) on the order of, or less than, about 1 nm. The gate region 20 can be deposited directly on the top surface of the high-k dielectric layer 18 by, for example, chemical vapor deposition (CVD), physical vapor deposition (PVD), or atomic layer deposition (ALD). As non-limiting examples the gate region 20 can include a metal system selected from one or more of TiN, TiC, TaN, TaC, TaSiN, HfN, W, Au, Cu, Al and Ru.

In the bottom-gate configuration shown in FIG. 2 the gate region 20 may be pre-fabricated on or in the substrate 10 and may be covered with a thin (e.g., 1 nm to 100 nm) layer of oxide or a high-k dielectric to form the gate dielectric 18. The graphene layer 12 is then transferred to the substrate 10 having the embedded gate region 20, followed by the formation of the source and drain regions 14, 16. As one non-limiting example, a CVD carbon-deposition process on a metal (e.g., Cu) can be performed, followed by application of a layer of polymer (which functions as a handle substrate), followed by selectively etching the Cu, transferring the handle substrate, and then removal of the handle (polymer) substrate by any suitable removal process.

The gate length of the graphene FET 100 can be, for example, about 100 nm or less.

Figure 3:
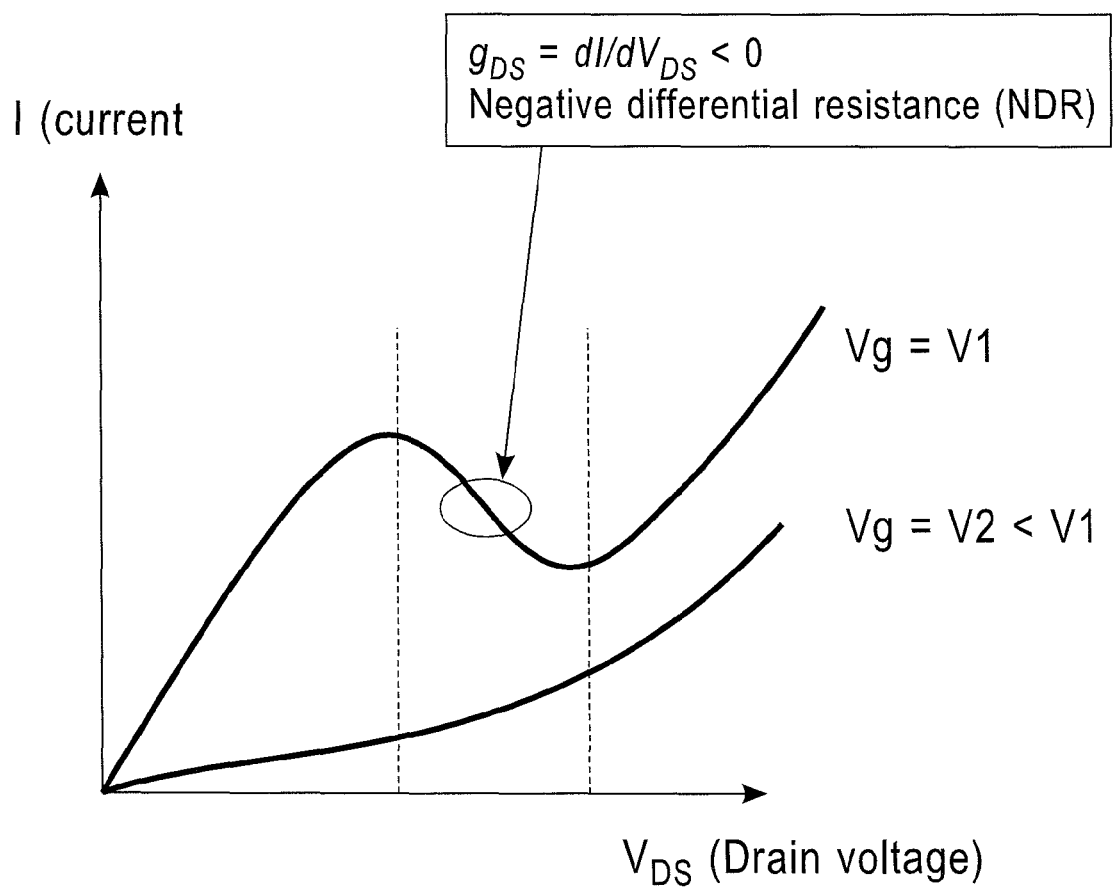
FIG. 3 is a graph that plots current (I) versus drain voltage ($V_{DS}$) and is useful when explaining the current-voltage characteristics of the graphene FET of FIGS. 1 and 2 and, in particular, the negative voltage differential resistance (NDR) operation of the graphene FET.

FIG. 3 shows a typical current-voltage (I-V) characteristics of the graphene field-effect device 100 at two different gate voltages ($V_g$, i.e., $V_g=V_1$ and $V_g=V2-V1$). The current-voltage characteristics are highly dependent on the gate voltage, and for certain gate voltages a negative differential resistance (NDR) region can be observed (for $V_g=V1$ in the example of FIG. 3). The NDR region is manifested by a negative slope in the I-V curve and is characterized as:

$$g_{DS}=dI/dV_{DS}<0.$$

The existence of this negative differential resistance feature, and the control thereof, in the graphene FET 100 is important for achieving the generation of high-frequency signals. In addition, and as will be noted below, control of the negative differential resistance feature enables a high frequency signal, not necessarily a THz frequency signal, to be rapidly switched or gated on and off.

It can be noted that in order to achieve the negative resistance behavior in the graphene FET 100 that it is desirable to have: a thin gate dielectric 18, a high-k gate dielectric 18, and the graphene channel 12 with high carrier mobility. One distinguishing feature of the graphene NDR device 100, as compared to conventional two terminal NDR devices, is that the I-V (current-voltage) characteristics can be modulated and controlled by the gate voltage $V_g$ as shown in FIG. 3.

Figure 4:
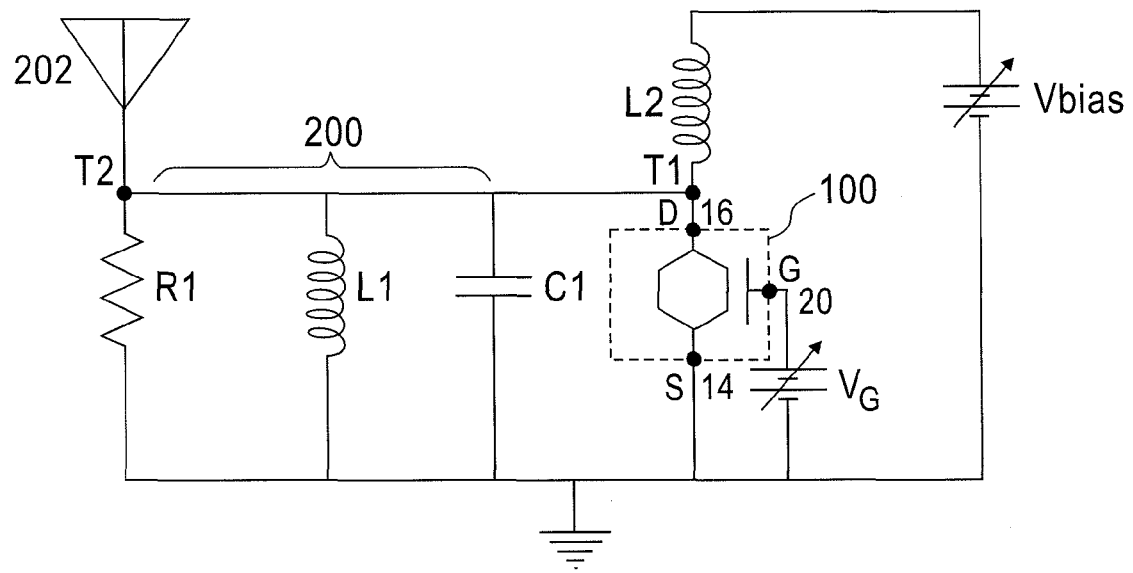
FIGS. 4 and 5 show embodiments of resonant circuits, each coupled with a radiator, that include the graphene FET of either FIG. 1 or FIG. 2.
Figure 5:
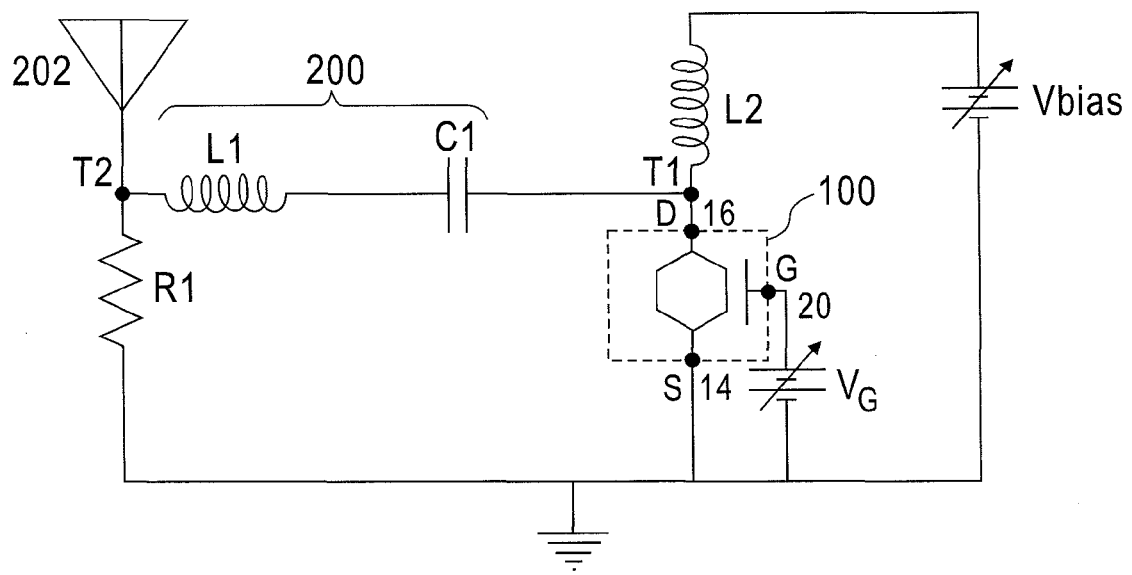

FIGS. 4 and 5 show embodiments of resonant circuits 200, each coupled with a radiator 202, that include the graphene FET 100 of either FIG. 1 or FIG. 2. In general the source and drain can be considered as being symmetric. For an n-type device the drain bias should be greater than the source bias. For the examples shown in FIGS. 4 and 5 (with a positive Vbias) the source 14 is connected to ground and the drain 16 to a node T1 (connected to Vbias via an inductance L2). A negative bias is used if the graphene FET 100 is p-type. L2 functions as a high frequency choke and is provided to prevent high frequency signals from leaking into the power supply loop.

FIG. 4 shows an exemplary circuit embodiment to provide THz/microwave generation based on the graphene NDR FET device 100. In this exemplary configuration the drain region 16 of the graphene FET 100 is connected to resonant circuit 200 that is characterized by an inductance L1, a capacitance C1 and a resistance R1. The resonant frequency f0 is determined by the inductance L1 and the capacitance C1 as f0=1/(2π*sqrt(L1*C1)). The resistance R1 represents a load and/or parasitic resistance present in these components and is not a separately provided bulk resistance component. By biasing the graphene FET 100 into the NDR state via $V_{bias}$ (applied to the drain region 16 via L2) and $V_g$ (applied to the gate region 20) a small-signal resistance equal to or less than zero can be achieved in the overall circuit, resulting in an oscillation in current and voltage in the circuit at a frequency f0=1/(2π*sqrt(L1*C1)). Electromagnetic radiation at such a frequency can be generated and emitted by connecting the radiator 202, such as an antenna and/or a wave guide, to the circuit 200. As opposed to other high-frequency oscillators using two-terminal NDR diodes, the output frequency of the resulting THz/microwave source can be tuned by controlling the gate voltage $V_g$. For example, since the output power is related to the extent of the NDR region in the I-V characteristics, the output power can be controlled by the gate voltage $V_g$. Also, by switching the graphene FET 100 between the NDR and the non-NDR states using the gate voltage $V_g$ (see FIG. 3) the output frequency of the oscillator circuit can be rapidly switched on and off, which can be useful in many types of applications including communication applications.

Another exemplary embodiment of the circuit for the THz/microwave generation is shown in FIG. 5. As opposed to the parallel connection of L1 and C1 as in FIG. 4 in this embodiment L1 and C1 are connected in series. As before, R1 can represent the load and/or parasitic resistance present in these components. As in the embodiment of FIG. 4, by biasing the graphene FET 100 into the NDR state via $V_{bias}$ and $V_g$ a small-signal resistance equal to or less than zero can be achieved in the overall circuit, resulting in an oscillation in current and voltage in the circuit at a frequency f0=1/(2π*sqrt(L1*C1)). Also as in the embodiment of FIG. 4, by switching the graphene FET 100 between the NDR and the non-NDR states using the gate voltage $V_g$ the output frequency of the oscillator circuit can be rapidly switched on and off.

In the embodiments of both FIGS. 4 and 5 the resonant circuit 200 can be considered to be a two terminal circuit element having a first terminal (T1) connected to the graphene FET 100 (e.g., to the drain terminal 16) and a second terminal T2 connectable with the radiator 202. It is noted again that the resistor R1 will typically not be physical, distinct circuit element and is, in fact, a parasitic part of the inductor L1. The radiator 202 can be connected anywhere in the LC circuit. For use in the THz frequency range exemplary values of L1 and C1 can be about 1 pico-Henry and 40 femto-Farads, respectively, and exemplary values of Vbias and Vg can be about 2 Volts.

Note in the embodiments of FIGS. 4 and 5 that the generated THz/microwave oscillator output frequency can be modulated (e.g., amplitude modulated) prior to transmission from the radiator 202 so as to transmit a carrier wave conveying, e.g., data and/or voice signals to one or more receivers.

As was mentioned above, two or more of the graphene-based NDR devices 100 can be provided and coupled to the radiator 202 in order to increase the overall output power from the radiator 202.

The embodiments of this invention thus provide a method and structure for generating high frequency signals using a three terminal field effect transistor having a graphene channel disposed between source and drain electrodes, where the graphene channel is electrically coupled to a gate electrode for being biased by the gate electrode into the negative differential resistance region of operation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

What is claimed is:

1. A device for generating high frequency signals, comprising:
   a gate electrode connected to a variable voltage source;
   a source electrode;
   a drain electrode; and
   a graphene channel disposed between the source electrode and the drain electrode and electrically connected thereto, where the graphene channel is disposed relative to the gate electrode for being biased by the gate electrode into a negative differential resistance region of operation, where
   the device is connected with a resonant circuit having a first terminal connected to the device, the resonant circuit comprising an inductance and a capacitance and having a second terminal connected to a radiator, and where
   output power from the radiator is controlled with a voltage applied to the gate electrode from the variable voltage source.

2. The device as in claim 1, further comprising a dielectric layer disposed between the graphene channel and the gate electrode.

3. The device as in claim 2, where the dielectric layer is comprised of a material having a dielectric constant that is greater than the dielectric constant of silicon nitride.

4. The device as in claim 2, further comprising a substrate, where the graphene channel is disposed over a surface of the substrate in electrical contact with the source electrode and the drain electrode, and where the gate electrode is disposed over the surface of the substrate.

5. The device as in claim 2, further comprising a substrate, where the graphene channel is disposed over a surface of the substrate in electrical contact with the source electrode and the drain electrode, and where the gate electrode is disposed beneath the surface of the substrate.

6. A circuit, comprising:
   a field effect transistor; and
   a resonant circuit having a first terminal connected to the field effect transistor, the resonant circuit comprising an inductance and a capacitance and having a second terminal connected to a radiator, where
   the field effect transistor is comprised of a gate electrode coupled to a source of gate voltage, a source electrode, a drain electrode and a graphene channel disposed between the source electrode and the drain electrode and electrically connected thereto, where the graphene channel is disposed relative to the gate electrode for being biased by the gate electrode into a negative differential resistance region of operation,
   where the source of gate voltage provides a variable gate voltage, and where
   output power from the radiator is controlled with a voltage applied to the gate electrode from the voltage source.

7. The circuit of claim 6, where the first terminal of the resonant circuit is connected to the drain electrode, and where the source electrode is connected to a source of bias voltage.

8. The circuit of claim 6, where the inductance and the capacitance are connected in parallel.

9. The circuit of claim 6, where the inductance and the capacitance are connected in series.

10. The circuit of claim 6, where when the graphene channel is biased by the gate electrode into the negative differential resistance region of operation the circuit operates as an oscillator having a fundamental frequency in a range that comprises 0.1 THz to 1 THz.

11. The circuit of claim 6, where when the graphene channel is biased by the gate electrode into the negative differential resistance region of operation the circuit operates as an oscillator that generates an output signal having a fundamental frequency, and where the source of gate voltage provides a variable gate voltage and where a change in the gate voltage operates to turn the output frequency of the oscillator on and off.

12. The circuit of claim 6, where when the graphene channel is biased by the gate electrode into the negative differential resistance region of operation the circuit operates as an oscillator, and where a resonant frequency 10 of the oscillator is determined by the inductance (L1) and the capacitance (C1) and is equal to ID=$1/(2\pi*\mathrm{sqrt}(L1*C1))$.

* * * * *